(12) United States Patent
Shishido et al.

(10) Patent No.: US 10,146,123 B2
(45) Date of Patent: Dec. 4, 2018

(54) MASK BLANK, PHASE SHIFT MASK, METHOD FOR MANUFACTURING PHASE SHIFT MASK, AND METHOD FOR MANUFACTURING SEMICONDUCTOR DEVICE (71) Applicant: HOYA CORPORATION, Tokyo (JP)

(72) Inventors: Hiroaki Shishido, Tokyo (JP); Osamu Nozawa, Tokyo (JP); Takenori Kajiwara, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 0 days.

(21) Appl. No.: 15/503,415

(22) PCT Filed: Oct. 7, 2015

(86) PCT No.: PCT/JP2015/078471
§ 371 (c)(1),
(2) Date: Feb. 13, 2017

(87) PCT Pub. No.: WO2016/103843
PCT Pub. Date: Jun. 30, 2016

(65) Prior Publication Data
US 2017/0285458 A1    Oct. 5, 2017

(30) Foreign Application Priority Data

Dec. 26, 2014 (JP) .................. 2014-265189

(51) Int. Cl.
G03F 1/32     (2012.01)
G03F 1/58     (2012.01)
G03F 1/80     (2012.01)
G03F 7/20     (2006.01)
H01L 21/027   (2006.01)
C23C 14/00    (2006.01)
C23C 14/06    (2006.01)
C23C 14/10    (2006.01)
C23C 14/18    (2006.01)
C23C 14/34    (2006.01)
G03F 7/34     (2006.01)

(52) U.S. Cl.
CPC ............ G03F 1/32 (2013.01); C23C 14/0057 (2013.01); C23C 14/0641 (2013.01); C23C 14/0664 (2013.01); C23C 14/0676 (2013.01); C23C 14/10 (2013.01); C23C 14/185 (2013.01); C23C 14/3407 (2013.01); C23C 14/3464 (2013.01); G03F 1/58 (2013.01); G03F 1/80 (2013.01); G03F 7/2006 (2013.01); G03F 7/34 (2013.01); H01L 21/027 (2013.01)

(58) Field of Classification Search
CPC ..... G03F 1/32; G03F 1/58; G03F 1/80; H01L 21/027

USPC .......................................................... 430/5
See application file for complete search history.

(56) References Cited

U.S. PATENT DOCUMENTS

| | | |
|---|---|---|
| 6,645,677 B1 | 11/2003 | Sandstrom |
| 2002/0122991 A1 | 9/2002 | Shiota et al. |
| 2002/0125443 A1 | 9/2002 | Sandstrom |
| 2003/0008219 A1 | 1/2003 | Kaneko et al. |
| 2003/0047691 A1 | 3/2003 | Musil et al. |
| 2003/0180631 A1 | 9/2003 | Shiota et al. |
| 2004/0229169 A1 | 11/2004 | Sandstrom |
| 2005/0112477 A1 | 5/2005 | Yoshikawa et al. |
| 2005/0244722 A1 | 11/2005 | Okada et al. |
| 2007/0082278 A1 | 4/2007 | Shiota et al. |
| 2007/0105058 A1 | 5/2007 | Sandstrom |
| 2008/0131821 A1 | 6/2008 | Sandstrom |
| 2012/0034552 A1 | 2/2012 | Okubo et al. |
| 2013/0288165 A1 | 10/2013 | Nam et al. |
| 2015/0338731 A1 | 11/2015 | Nozawa et al. |

FOREIGN PATENT DOCUMENTS

| | | |
|---|---|---|
| CN | 1459048 A | 11/2003 |
| JP | 2003-005347 A | 1/2003 |
| JP | 2003-248292 A | 9/2003 |
| JP | 2004-537758 A | 12/2004 |
| JP | 2005-284213 A | 10/2005 |
| JP | 2007-241136 A | 9/2007 |
| JP | 2010-217514 A | 9/2010 |
| JP | 2011-112824 A | 6/2011 |

(Continued)

OTHER PUBLICATIONS

Korea Office Action for Application No. 10-2016-7016865 dated Sep. 21, 2016.

(Continued)

Primary Examiner — Christopher G Young
(74) Attorney, Agent, or Firm — Sughrue Mion, PLLC (57) ABSTRACT A mask blank with phase shift film where changes in transmittance and phase shift to an exposure light of an ArF excimer laser are suppressed. The film transmits light of an ArF excimer laser at a transmittance of 2% or more and less than 10% and generates a phase difference of 150 degrees or more and 190 degrees or less between the exposure light transmitted through the phase shift film and the exposure light transmitted through the air for the same distance as a thickness of the phase shift film. The film has a stacked lower layer and upper layer, the lower layer containing metal and silicon and substantially free of oxygen. The upper layer containing metal, silicon, nitrogen, and oxygen. The lower layer is thinner than the upper layer, and the ratio of metal to metal and silicon of the upper layer is less than the lower layer.

13 Claims, 2 Drawing Sheets (56) References Cited

FOREIGN PATENT DOCUMENTS

| | | |
|---|---|---|
| JP | 2013-231952 A | 11/2013 |
| JP | 2014-145920 A | 8/2014 |
| TW | 201033729 A1 | 9/2010 |
| TW | 201435477 A | 9/2014 |

OTHER PUBLICATIONS

Taiwan Office Action for Application No. 104136205 dated Sep. 23, 2016.
International Search Report for PCT/JP2015/078471 dated Dec. 28, 2015 [PCT/ISA/210].

MASK BLANK, PHASE SHIFT MASK, METHOD FOR MANUFACTURING PHASE SHIFT MASK, AND METHOD FOR MANUFACTURING SEMICONDUCTOR DEVICE

CROSS REFERENCE TO RELATED APPLICATIONS

This application is a National Stage of International Application No. PCT/JP2015/078471, filed on Oct. 7, 2015, which claims priority from Japanese Patent Application No. 2014-265189, filed on Dec. 26, 2014, the contents of all of which are incorporated herein by reference in their entirety.

TECHNICAL FIELD

This invention relates to a mask blank, a phase shift mask manufactured using the mask blank, and method for its manufacture. This invention further relates to a method for manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In miniaturization of a semiconductor device pattern, it is necessary to shorten the wavelength of an exposure light source used in the photolithography, in addition to miniaturization of a mask pattern formed on the transfer mask. Shortening of wavelength has been advancing recently from the use of KrF excimer laser (wavelength 248 nm) to ArF excimer laser (wavelength 193 nm) as an exposure light source in the manufacture of semiconductor devices.

As for the types of a transfer mask, a half tone phase shift mask is known in addition to a conventional binary mask having a light shielding pattern formed from a chromium-based material on a transparent substrate. Molybdenum silicide (MoSi)-based material is widely used for a phase shift film of the half tone phase shift mask. However, as disclosed in Publication 1, it has been discovered recently that the MoSi-based film has a low resistance to exposure light of an ArF excimer laser (so-called ArF light fastness). In Publication 1, ArF light fastness is enhanced by subjecting a MoSi-based film after formation of a pattern under plasma treatment, UV irradiation treatment, or heat treatment to form a passivation film on a surface of the pattern of the MoSi-based film.

Publication 2 discloses a defect repairing technique where xenon difluoride ($XeF_2$) gas is supplied to a black defect part of a light shielding film while irradiating the part with an electron beam to etch and remove the black defect part (defect repair by irradiating charged particles such as an electron beam as above is hereafter simply referred to as EB defect repair). While the EB defect repair was originally used to repair black defects on an absorber film of a reflective mask for EUV lithography, it has recently been used for repairing black defects of a MoSi half tone mask as well.

PRIOR ART PUBLICATIONS

Patent Publications

[Publication 1]
Japanese Patent Application Publication 2010-217514

[Publication 2]
PCT Application Japanese Translation Publication 2004-537758

SUMMARY OF INVENTION

Problem to be Solved by the Invention

In a half tone phase shift mask used in photolithography where an ArF excimer laser light (wavelength 193 nm) is applied as an exposure light, it is necessary for a half tone phase shift film (hereafter simply referred to as "phase shift film") to simultaneously have a function to transmit an ArF exposure light at a predetermined transmittance, and a function to generate a predetermined phase difference (phase shift amount) between the ArF exposure light transmitting through the phase shift film and the light transmitted through the air for the same distance as a thickness of the phase shift film. A phase shift film with a property of a transmittance of less than 10% to ArF exposure light has been widely used. Further, phase shift amount of the phase shift film is generally set to about 180 degrees to enhance phase shift effect. A material for a phase shift film of a single layer structure (Single layer structure including a region where oxidation of surface layer is in evitable. A single layer structure is hereinafter deemed as including an oxidized region on its surface layer, excluding when particularly referring to the oxidized region of the surface layer.) which simultaneously satisfies both conditions of the phase shift amount and the transmittance to ArF exposure light as mentioned above and is capable of achieving lesser thickness is relatively limited. A material formed from molybdenum silicide nitride (MoSiN) satisfies these conditions, and has been used widely.

In manufacturing a phase shift mask using a mask blank including such a phase shift film, an exposure of a surface of the phase shift film to etching gas or cleaning liquid is inevitable in a manufacturing process of the mask. Even if an oxidization layer as a passivation film was pre-formed on a surface layer of the phase shift film at the stage of manufacturing a mask blank, it is still difficult to completely prevent etching gas and cleaning liquid from causing elution of molybdenum in the phase shift film or further advancement of oxidization toward the interior of the phase shift film. Further, the finished phase shift mask needs to be set upon an exposure apparatus for continuous use, or subjected regularly to mask cleaning. It is difficult to completely prevent elution of molybdenum in the phase shift film or further advancement of oxidization toward the interior of the phase shift film that occurs in the mask cleaning.

In a phase shift film, when elution of molybdenum in the film or further advancement of oxidization toward the interior of the phase shift film occurs, a transmittance and phase shift amount of the phase shift film both change. The amount of these changes is preferably small in the phase shift film. Including a certain amount of oxygen throughout the phase shift film beforehand at the stage of forming the phase shift film on the transparent substrate helps inhibition of subsequent changes in transmittance and phase shift amount in the phase shift film. Further, reducing the molybdenum content of the phase shift film (e.g., ratio of molybdenum content [atomic %] to the total content of molybdenum and silicon [atomic %] is 7% or less) at the stage of forming the phase shift film also helps inhibition of subsequent changes in transmittance and phase shift amount in the phase shift film.

However, the following problem was recognized in the case of a mask blank with a phase shift film formed from a molybdenum-silicide-based material where oxygen has been included beforehand, namely, a phase shift film of a single layer structure formed from MoSiON. In the case where a black defect was found on a phase shift film in a mask inspection upon manufacture of a phase shift mask from a mask blank, repairing the defect through EB defect repair is increasing. It has been newly discovered that, in repairing a defect by EB defect repair on a black defect of a phase shift film of a single layer structure formed from MoSiON, detection of an etching end point for detecting a boundary between the phase shift film and the transparent substrate is more difficult than in the case of a phase shift film of a single layer structure formed from MoSiN. On the other hand, there is a problem that when molybdenum content of the phase shift film decreases, etching rate when a black defect of the phase shift film is subjected to EB defect repair mentioned above decreases. These problems are considered to occur similarly in metal silicide oxynitride using metal elements other than Mo.

This invention was made to solve conventional problems. The object of the invention is to provide a mask blank having a phase shift film on a transparent substrate, which reduces changes in transmittance and phase shift amount to exposure light caused by elution of metal elements and further advancement of oxidization of a surface layer upon mask manufacturing process and mask cleaning and serves for relatively easier detection of an etching end point for detecting a boundary between the phase shift film and the transparent substrate upon EB defect repair. A further object is to provide a phase shift mask manufactured using the mask blank. Another object is to provide a method for manufacturing such a phase shift mask. Yet another object of this invention is to provide a method for manufacturing a semiconductor device using such a phase shift mask.

Means for Solving the Problem

To solve the above problems, this invention includes the following structures.
(Structure 1)
A mask blank including a phase shift film on a transparent substrate, in which:
the phase shift film has a function to transmit an exposure light of an ArF excimer laser at a transmittance of 2% or more and less than 10%, and a function to generate a phase difference of 150 degrees or more and 190 degrees or less between the exposure light transmitted through the phase shift film and the exposure light transmitted through air for a same distance as a thickness of the phase shift film,
the phase shift film has a structure where a lower layer and an upper layer are stacked from a side of the transparent substrate,
the lower layer is formed from a material containing metal and silicon and substantially free of oxygen,
the upper layer is formed from a material containing metal, silicon, nitrogen, and oxygen,
a thickness of the lower layer is less than a thickness of the upper layer, and
a ratio of a content of metal to a total content of metal and silicon in the upper layer is less than a ratio of a content of the metal to a total content of the metal and silicon in the lower layer.
(Structure 2)
The mask blank according to Structure 1, in which a ratio of a content of the metal to a total content of the metal and silicon in the upper layer is 7% or less.

(Structure 3)
The mask blank according to Structure 1 or 2, in which a ratio of a content of the metal to a total content of the metal and silicon in the lower layer is 8% or more.
(Structure 4)
The mask blank according to any of Structures 1 to 3, in which the lower layer is formed in contact with a surface of the transparent substrate.
(Structure 5)
The mask blank according to any of Structures 1 to 4, in which the lower layer is formed from a material including metal and silicon.
(Structure 6)
The mask blank according to any of Structures 1 to 5, in which the phase shift film has a thickness of 90 nm or less.
(Structure 7)
The mask blank according to any of Structures 1 to 6, in which the lower layer has a thickness of 2 nm or more.
(Structure 8)
The mask blank according to any of Structures 1 to 7, in which the upper layer includes a layer with more oxygen content on a surface layer than a portion of the upper layer excluding the surface layer.
(Structure 9)
The mask blank according to any of Structures 1 to 8 including a light shielding film on the phase shift film.
(Structure 10)
A phase shift mask having a transfer pattern formed on the phase shift film of the mask blank of Structure 9, and in which a pattern including a light shielding band pattern is formed on the light shielding film.
(Structure 11)
A method for manufacturing a phase shift mask using the mask blank according to Structure 9, including the steps of:
forming a transfer pattern on the light shielding film by dry etching,
forming a transfer pattern on the phase shift film by dry etching with the light shielding film having the transfer pattern as a mask, and
forming a pattern including a light shielding band pattern on the light shielding film by dry etching with a resist film having a pattern including a light shielding band pattern as a mask.
(Structure 12)
A method for manufacturing a semiconductor device including the step of using the phase shift mask according to Structure 10 and subjecting a resist film on a semiconductor substrate to exposure transfer of the transfer pattern.
(Structure 13)
A method for manufacturing a semiconductor device including the step of using the phase shift mask manufactured by the method for manufacturing the phase shift mask according to Structure 11 and subjecting a resist film on a semiconductor substrate to exposure transfer of the transfer pattern.

Effect of Invention

The mask blank of this invention can reduce changes in transmittance and phase shift amount to exposure light caused by elution of metal elements from the phase shift film and further advancement of oxidization of a surface layer, while having a structure including a phase shift film formed from a material containing metal and silicon on a transparent substrate. In addition, the phase shift film facilitates detection of an etching end point for detecting a boundary between the phase shift film and the transparent substrate when EB defect repair was carried out, so that insufficient defect repair and inadvertent digging of the transparent substrate can be avoided.

EMBODIMENTS OF THE INVENTION

Each embodiment of this invention is explained below.

The inventors of this invention made diligent studies on a phase shift film in which, while ensuring a predetermined phase difference (150 degrees or more and 190 degrees or less), allowing a transmittance of 2% or more and less than 10%, and in which detection of etching end point for detecting a boundary between the phase shift film and the transparent substrate is easy when a repair was made by EB defect repair, based on a structure of a phase shift film of a single layer structure formed from metal silicide oxynitride represented by MoSiON.

In EB defect repair, when an electron beam is irradiated on a black defect, at least one of Auger electron, secondary electron, characteristic X-ray, and backscattered electron discharged from the irradiated portion is detected and its change is observed to detect an etching end point. For example, in the case of detecting Auger electrons discharged from the portion irradiated with electron beam, change of material composition is mainly observed by Auger electron spectroscopy (AES). In the case of detecting secondary electrons, change of surface shape is mainly observed from SEM image. In the case of detecting characteristic X-ray, change of material composition is mainly observed by energy dispersive X-ray spectrometry (EDX) or wavelength-dispersive X-ray spectrometry (WDX). In the case of detecting backscattered electrons, change of material composition and crystal state is mainly observed by electron beam backscatter diffraction (EBSD).

In the case of forming a phase shift film from a metal silicide compound, optical properties required in the phase shift film are generally restricted. Therefore, ratio [%] where metal content [atomic %] in the material is divided by total content of metal and silicon [atomic %] (hereafter, the ratio is referred to as "M/[M+Si] ratio") must be at least 20% or less. Namely, metal content of the phase shift film has not been large.

In the case of a conventional phase shift film of a single layer structure formed from metal silicide nitride represented by MoSiN, while metal content is relatively small (M/[M+Si] ratio of 20% or less), etching end point could be detected by any etching end point detecting method in EB defect repair. However, as mentioned above, there is a problem that a phase shift film formed from such materials has relatively great changes in transmittance and phase shift amount caused by elution of metal elements and further advancement of oxidization of a surface layer upon mask manufacturing process and mask cleaning.

On the other hand, in the case of a phase shift film of a single layer structure formed from metal silicide oxynitride, since both silicon and oxygen, which are major elements forming the transparent substrate, are included, there is a problem of difficulty in detecting an etching end point using any etching end point detecting method given above in EB defect repair. Further, there is a problem of difficulty in ensuring etching selectivity. Detection of an etching end point and ensuring of etching selectivity are particularly difficult in the case of a structure where metal element content has been reduced (e.g., ratio of M/[M+Si] is 7% or less) to prevent changes in transmittance and phase shift amount of a phase shift film associated with elution of metal elements.

The inventors of this invention conceived of a phase shift film structured by stacking a layer formed from metal silicide-based material substantially free of oxygen (oxygen-free metal silicide-based material) and a layer formed from metal silicide oxynitride, so that each layer of materials exhibits its merits while solving demerits. First, a layer formed from oxygen-free metal silicide-based material was disposed at a transparent substrate side as a lower layer, and a layer formed from metal silicide oxynitride was stacked on the lower layer as an upper layer, so that a phase shift film with a structure of stacked layers was formed. This resulted in facilitating detection of an etching end point between the phase shift film and the transparent substrate in EB defect repair.

Next, M/[M+Si] ratio of the upper layer formed from metal silicide oxynitride in the phase shift film was made smaller than M/[M+Si] ratio of the lower layer formed from oxygen-free metal silicide-based material. Further, the thickness of the lower layer formed from oxygen-free metal silicide-based material in the phase shift film was made smaller than the thickness of the upper layer formed from metal silicide oxynitride. M/[M+Si] ratio of the upper layer that is likely to be exposed to etching gas and cleaning liquid was made smaller than M/[M+Si] ratio of the lower layer, and the thickness of the upper layer with relatively high resistivity was made greater than the thickness of the lower layer, resulting in reduction of changes in transmittance and phase shift amount of the phase shift film associated with elution of metal elements than conventional phase shift film.

On the other hand, it was discovered that, even in the case where elements other than the primary elements (lower layer is metal, silicon, nitrogen; upper layer is metal, silicon, nitrogen, oxygen) were included in the material of each layer in the lower layer and the upper layer of the phase shift film, optical characteristics of the phase shift film and characteristics relevant to EB defect repair are less affected or within an acceptable range, when total content of elements other than the primary elements in the phase shift film is within the range of 10 atomic % or less. A conclusion was made that the technical problem can be solved by the structure of the phase shift film as described above.

Namely, this invention is a mask blank having a phase shift film on a transparent substrate, the phase shift film has a function to transmit an exposure light of ArF excimer laser at a transmittance of 2% or more and less than 10% and a function to generate a phase difference of 150 degrees or more and 190 degrees or less between the exposure light transmitted through the phase shift film and the exposure light transmitted through the air for the same distance as a thickness of the phase shift film, the phase shift film includes a structure where a lower layer and an upper layer are stacked from the transparent substrate side, the lower layer is formed from a material containing metal and silicon and substantially free of oxygen, the upper layer is formed from a material containing metal, silicon, nitrogen, and oxygen, the thickness of the lower layer is less than the thickness of the upper layer, and the ratio of metal content to total content of metal and silicon in the upper layer is less than the ratio of metal content to total content of metal and silicon in the lower layer.

Figure 1:
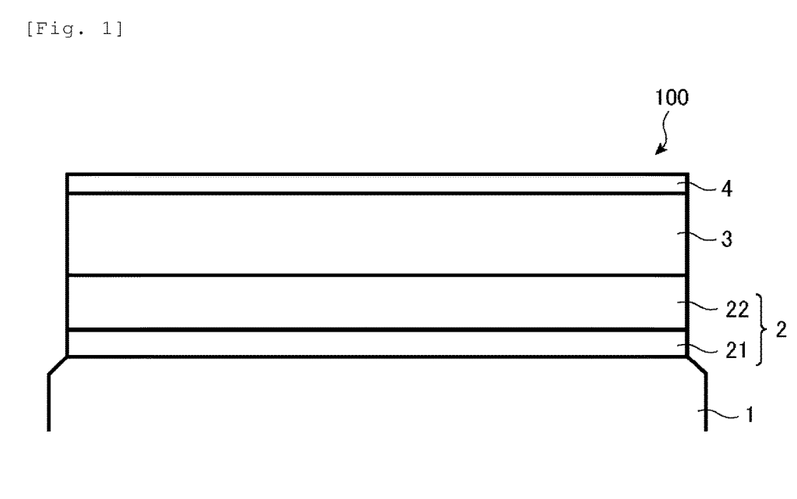
FIG. 1 is a cross-sectional view showing a structure of the mask blank of an embodiment of this invention.

FIG. 1 is a cross-sectional view showing a structure of a mask blank 100 of an embodiment of this invention. The mask blank 100 of this invention shown in FIG. 1 has a structure having a phase shift film 2, a light shielding film 3, and a hard mask film 4 stacked in this order on a transparent substrate 1.

It is required for the phase shift film 2 that a transmittance to an exposure light with a wavelength of 200 nm or less such as an ArF excimer laser (hereafter referred to as ArF exposure light) is 2% or more and less than 10%. To generate sufficient phase shift effect between the exposure light transmitted through the interior of the phase shift film 2 and the exposure light transmitted through the air, at least 2% transmittance to the exposure light is necessary. Transmittance of the phase shift film 2 to the exposure light is preferably 3% or more, and more preferably 4% or more. On the other hand, as a transmittance of the phase shift film 2 to the exposure light increases, calculation load of bias caused by an electromagnetic field effect (EMF bias) in optical simulation performed upon designing a mask pattern tends to increase. Taking this point into consideration, a transmittance of the phase shift film 2 to the exposure light is preferably less than 10%, more preferably 9% or less, and even more preferably 8% or less.

To obtain a proper phase shift effect, it is desired for the phase shift film 2 to be adjusted such that a phase difference that generates between the transmitting ArF exposure light and the light transmitted through the air for the same distance as a thickness of the phase shift film 2 is in the range of 150 degrees or more and 190 degrees or less. The lower limit of the phase difference of the phase shift film 2 is preferably 160 degrees or more, and more preferably 170 degrees or more. On the other hand, the upper limit of the phase difference of the phase shift film 2 is preferably 180 degrees or less, and more preferably 179 degrees or less. This is for the purpose of reducing an influence of increase in phase difference caused by microscopic etching of the transparent substrate 1 upon dry etching in forming a pattern on the phase shift film 2. Another reason is a recently increasing irradiation method of ArF exposure light to a phase shift mask by an exposure apparatus, in which ArF exposure light enters from a direction that is oblique at a predetermined angle to a vertical direction of a film surface of the phase shift film 2.

The phase shift film 2 has a structure where the lower layer 21 and the upper layer 22 are stacked from the transparent substrate 1 side. The lower layer 21 of the phase shift film 2 is formed from a material containing metal and silicon and substantially free of oxygen. As stated above, the lower layer 21 is provided to facilitate detection of an etching end point between the phase shift film 2 and the transparent substrate 1 upon EB defect repair, which contributes to reducing the thickness of the entire phase shift film 2. Therefore, it is necessary that the lower layer 21 is of a material that is substantially free of oxygen. The material substantially free of oxygen herein is a material with an oxygen content of at least 5 atomic % or less. The oxygen content of the material forming the lower layer 21 is preferably 3 atomic % or less, and more preferably at or less than detection lower limit when composition analysis was made through X-ray photoelectron spectroscopy, etc. The lower layer 21 is preferably formed from a material including metal and silicon, or a material including metal, silicon, and nitrogen, and more preferably formed from a material including metal and silicon.

A metal element to be included in the material forming the lower layer 21 is preferably a transition metal element. The transition metal element in this case is one or more metal elements among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd). Metal element other than the transition metal elements to be included in the material forming the lower layer 21 includes aluminum (Al), indium (In), tin (Sn), gallium (Ga), etc. In addition to the elements above, the material forming the lower layer 21 can include elements such as carbon (C), hydrogen (H), boron (B), germanium (Ge), and antimony (Sb). The material forming the lower layer 21 can include inert gas such as helium (He), argon (Ar), krypton (Kr), and xenon (Xe).

In the case where the lower layer 21 is formed from a material containing metal, silicon, and nitrogen, the nitrogen content is preferably 20 atomic % or less, more preferably 19 atomic % or less, and even more preferably 15 atomic % or less. On the other hand, nitrogen content of the material forming the lower layer 21 in this case is preferably 5 atomic % or more, and more preferably 10 atomic % or more.

The upper layer 22 of the phase shift film 2 is formed from a material containing metal, silicon, nitrogen, and oxygen. As stated above, to reduce variation of transmittance and phase shift amount of the phase shift film 2, it is necessary to include oxygen upon forming the upper layer 22. Considering these points, oxygen content of the material forming the upper layer 22 is preferably more than 5 atomic %, more preferably 10 atomic % or more, and even more preferably 12 atomic % or more. As oxygen content in a material increases, oxygen tends to reduce both refractive index n and extinction coefficient k of the material. Therefore, as oxygen content in the upper layer 22 increases, the thickness of the entire phase shift film 2 necessary to ensure a predetermined transmittance and phase difference to ArF exposure light in the entire phase shift film 2 increases. Considering these points, oxygen content of the material forming the upper layer 22 is preferably 30 atomic % or less, more preferably 25 atomic % or less, and even more preferably 20 atomic % or less.

As nitrogen content in a material increases, refractive index n of the material tends to relatively increase, and extinction coefficient k tends to relatively decrease. Nitrogen content of the material forming the upper layer 22 is preferably 20 atomic % or more, more preferably 25 atomic % or more, and even more preferably 30 atomic % or more. On the other hand, nitrogen content of the material forming the upper layer 22 is preferably 50 atomic % or less, more preferably 45 atomic % or less, and even more preferably 40 atomic % or less.

Total content of nitrogen and oxygen in the upper layer is required to be greater than total content of nitrogen and oxygen in the lower layer 21. The difference obtained by subtracting total content of nitrogen and oxygen in the lower layer 21 from total content of nitrogen and oxygen in the upper layer 22 is preferably at least 10 atomic % or more, more preferably 15 atomic % or more, and even more preferably 20 atomic % or more. Further, the difference obtained by subtracting total content of nitrogen and oxygen in the lower layer 21 from total content of nitrogen and oxygen in the upper layer 22 is preferably at least 60 atomic % or less, more preferably 55 atomic % or less, and even more preferably 50 atomic % or less.

The lower layer 21 is preferably formed in contact with a surface of the transparent substrate 1. This is because upon EB defect repair, it is preferable that a film of a material causing difficulty in EB defect repair (e.g., film of chromium-based material) does not exist between the transparent substrate 1 and the lower layer 21. Another reason is that since the phase shift film 2 is provided with the lower layer 21, detection of etching end point between the phase shift film 2 and the transparent substrate 1 is relatively easy upon EB defect repair, even if the transparent substrate 1 of a glass material and the lower layer 21 are in contact.

M/[M+Si] ratio in the upper layer 22 is required to be smaller than M/[M+Si] ratio in the lower layer 21. The reason is that, while variation of transmittance and phase shift amount needs to be inhibited in the upper layer 22 and M/[M+Si] ratio should be small, the lower layer 21 is required to have a function to facilitate detection of an etching end point upon EB defect repair, and M/[M+Si] ratio should be large. Difference obtained by subtracting M/[M+Si] ratio in the upper layer 22 from M/[M+Si] ratio in the lower layer 21 is preferably at least 2% or more, and more preferably 5% or more.

On the other hand, difference obtained by subtracting M/[M+Si] ratio in the upper layer 22 from M/[M+Si] ratio in the lower layer 21 is preferably at least 15% or less. Difference in M/[M+Si] ratio between the lower layer 21 and the upper layer 22 being greater than 15% causes greater difference in etching rate in EB defect repair between the lower layer 21 and the upper layer 22, so that a step is likely to generate in a portion of the shape of side walls of the pattern of the phase shift film 2 upon which EB defect repair was carried out. Difference obtained by subtracting M/[M+Si] ratio in the upper layer 22 from M/[M+Si] ratio in the lower layer 21 is preferably 10% or less, and more preferably 8% or less.

For the lower layer 21 to sufficiently exhibit the function to facilitate detection of an etching end point upon EB defect repair, M/[M+Si] ratio of the material forming the lower layer 21 is required to be at least 8% or more, more preferably 9% or more, and even more preferably 10% or more. Further, M/[M+Si] ratio of the material forming the lower layer 21 is required to be at least 20% or less. When M/[M+Si] ratio of the lower layer 21 is greater than 20%, extinction coefficient k of the lower layer 21 increases, rendering it necessary to significantly reduce the thickness of the lower layer 21 to adjust the transmittance of the entire phase shift film 2 to ArF exposure light within a predetermined range. The thickness of the lower layer 21 being too small causes difficulty for the lower layer 21 to exhibit the function to facilitate the detection of an etching end point upon EB defect repair. Further, resistance of the lower layer 21 to accumulated irradiation of ArF exposure light decreases as well. M/[M+Si] ratio of the material forming the lower layer 21 is preferably 15% or less, and more preferably 12% or less.

On the viewpoint of reducing variation of transmittance and phase shift amount of the phase shift film 2, it is not only preferable to include oxygen in the upper layer 22 beforehand, but is also preferable to reduce metal content in the upper layer 22. However, absence of a metal element contributing to enhancing both refractive index n and extinction coefficient k in the material forming the upper layer 22 of the phase shift film 2 causes a problem of increasing the entire thickness of the phase shift film 2. There is another problem of increasing defects caused by low conductivity of metal silicide target when the upper layer 22 is formed by DC sputtering. Taking these points into consideration, M/[M+Si] ratio in the upper layer 22 is preferably 2% or more, and more preferably 3% or more. On the other hand, on the viewpoint of reducing variation in transmittance and phase shift amount of the phase shift film 2 (upper layer 22), M/[M+Si] ratio in the upper layer 22 is preferably 7% or less, more preferably 6% or less, and even more preferably 5% or less.

The matters regarding metal elements to be included in the material forming the upper layer 22, the matters regarding metals other than transition metal elements to be included in the material forming the upper layer 22, and the matters regarding other elements to be included in the material forming the upper layer 22 are similar to the case of the lower layer 21. It is preferable that the material forming the lower layer 21 and the material forming the upper layer 22 both include similar metal elements. The upper layer 22 and the lower layer 21 are patterned by dry etching using the same etching gas. Therefore, the upper layer 22 and the lower layer 21 are preferably etched in the same etching chamber. When the metal elements included in each material forming the upper layer 22 and the lower layer 21 are the same, environmental change in the etching chamber can be reduced when the object to be dry-etched changes from the upper layer 22 to the lower layer 21.

The thickness of the phase shift film 2 is required to be at least 90 nm or less. This is to reduce bias caused by an electromagnetic field effect (EMF bias). The thickness of the phase shift film 2 is preferably 85 nm or less, and more preferably 80 nm or less. Further, the thickness of the phase shift film 2 is required to be 50 nm or more, more preferably 55 nm or more, and even more preferably 60 nm or more.

The thickness of the lower layer 21 of the phase shift film 2 is required to be less than the thickness of the upper layer 22. When the thickness of the lower layer 21 is greater than ½ thickness of the entire phase shift film 2, it will be difficult to make transmittance of the entire phase shift film 2 to ArF exposure light within a predetermined range and to satisfy a predetermined phase shift amount. The thickness of the lower layer 21 is preferably ⅓ or less the entire thickness of the phase shift film 2, and more preferably ⅕ or less. Further, the thickness of the lower layer 21 is preferably 1/30 or more the thickness of the entire phase shift film 2, more preferably 1/20 or more, and even more preferably 1/15 or more.

For the lower layer 21 to exhibit its function, etc. to facilitate detection of an etching end point between the phase shift film 2 and the transparent substrate 1 upon EB defect repair, the thickness is required to be 2 nm or more. The lower layer 21 is preferably 3 nm or more, and more preferably 5 nm or more. On the other hand, when the lower layer 21 is too thick, it will be difficult to achieve 10% or less transmittance of the entire phase shift film 2 to ArF exposure light. Taking this point into consideration, the thickness of the lower layer 21 is required to be 30 nm or less, preferably 25 nm or less, and more preferably 20 nm or less.

For the entire phase shift film 2 to satisfy the conditions regarding the optical properties and film thickness mentioned above, the optical properties of the lower layer 21 and the upper layer 22 are required to be within a predetermined range. Refractive index n of the lower layer 21 is preferably 1.00 or more, and more preferably 1.10 or more. Further, refractive index n of the lower layer 21 is preferably 1.90 or less, and more preferably 1.70 or less. Extinction coefficient k of the lower layer 21 is preferably 2.40 or more, and more preferably 2.60 or more. Further, extinction coefficient k of the lower layer 21 is preferably 3.30 or less, and more preferably 3.00 or less.

On the other hand, refractive index n of the upper layer is preferably 2.00 or more, and more preferably 2.10 or more. On the other hand, refractive index n of the upper layer 22 is preferably 2.65 or less, and more preferably 2.55 or less. Extinction coefficient k of the upper layer 22 is preferably 0.20 or more, and more preferably 0.30 or more. On the other hand, extinction coefficient k of the upper layer 22 is preferably 0.60 or less, and more preferably 0.50 or less.

Refractive index n and extinction coefficient k of a thin film including the phase shift film 2 are not determined only by the composition of the thin film. Film density and crystal condition of the thin film are factors that affect refractive index n and extinction coefficient k. Therefore, the conditions in forming the thin film by reactive sputtering are adjusted so that the thin film reaches a desired refractive index n and extinction coefficient k. The condition for making the lower layer 21 and the upper layer 22 within the range of refractive index n and extinction coefficient k mentioned above is not limited to adjusting the ratio of mixed gas of noble gas and reactive gas (oxygen gas, nitrogen gas, etc.) in forming a film by reactive sputtering, but includes various conditions such as pressure in a film forming chamber, power applied to the sputter target, positional relationship between the target and the transparent substrate 1 such as distance, etc. in film formation through reactive sputtering. Further, these film forming conditions are specific to a film forming apparatus, and are adjusted arbitrarily for the lower layer 21 and the upper layer 22 to be formed to achieve desired refractive index n and extinction coefficient k.

While the lower layer 21 and the upper layer 22 of the phase shift film 2 are formed through sputtering, any sputtering including DC sputtering, RF sputtering, ion beam sputtering, etc. is applicable. In the case where the target has low conductivity, application of RF sputtering and ion beam sputtering is preferable. However, application of RF sputtering is more preferable, considering film forming rate.

In the steps where the lower layer 21 and the upper layer of the phase shift film 2 are each formed through sputtering, the lower layer 21 and the upper layer 22 cannot be formed with the same, single target. This is because the lower layer 21 and the upper layer 22 have different M/[M+Si] ratios. In the case where the lower layer 21 and the upper layer 22 are each formed from two targets with different M/[M+Si] ratios, they can be formed respectively in the same film forming chamber, or can be formed respectively in separate film forming chambers. Further, the lower layer 21 and the upper layer 22 with different M/[M+Si] ratios can be formed by using a silicon target and metal silicide target through sputtering that changes electrical voltage applied to each target. Moreover, the lower layer 21 and the upper layer with different M/[M+Si] ratios can be formed by using a silicon target and a metal silicide target through sputtering that changes electrical voltage applied to each target. In forming the lower layer 21 and the upper layer 22 in separate film forming chambers, the film forming chambers are preferably connected via, e.g., another vacuum chamber. In this case, a load-lock chamber through which the transparent substrate 1 is passed in introducing the transparent substrate in the atmosphere into the vacuum chamber is preferably connected to the vacuum chamber. A transportation apparatus (robotic hand) is preferably provided for transporting the transparent substrate 1 between the load-lock chamber, vacuum chamber, and each film forming chamber.

The upper layer 22 preferably has a layer with more oxygen content on its surface layer (hereafter simply referred to as surface oxidization layer) than the portion of the upper layer 22 excluding the surface layer. Various oxidization treatments are applicable as a method of forming the surface oxidization layer of the upper layer 22. The oxidization treatments include, for example, heat treatment in a gas containing oxygen such as the atmosphere, light irradiation treatment using a flash lamp, etc. in a gas containing oxygen, treatment to contact ozone and oxygen plasma on the uppermost layer, etc. It is particularly preferable to form a surface oxidization layer on the upper layer 22 through heat treatment or irradiation treatment using a flash lamp, etc. where an effect to reduce film stress of the phase shift film 2 can be obtained simultaneously. The thickness of the surface oxidization layer of the upper layer 22 is preferably 1 nm or more, and more preferably 1.5 nm or more. Further, the thickness of the surface oxidization layer of the upper layer 22 is preferably 5 nm or less, and more preferably 3 nm or less.

The transparent substrate 1 can be formed from synthetic quartz glass, and also from quartz glass, aluminosilicate glass, soda-lime glass, low thermal expansion glass ($SiO_2$—$TiO_2$ glass, etc.), etc. Among the above, synthetic quartz glass is particularly preferable as a material for forming the transparent substrate 1 of the mask blank 100 for having high transmittance to ArF excimer laser light.

The mask blank 100 has a light shielding film 3 on the phase shift film 2. Generally, in a binary transfer mask, an outer peripheral region of a region where a transfer pattern is formed (transfer pattern forming region) is desired to ensure an optical density (OD) of a predetermined value or more to prevent the resist film from being subjected to an influence of an exposure light that transmitted through the outer peripheral region when an exposure transfer was made on the resist film on a semiconductor wafer using an exposure apparatus. This point is similar in the case of a phase shift mask. Generally, the outer peripheral region of a transfer mask including a phase shift mask preferably has OD of 3.0 or more, and at least 2.8 or more is necessary. The phase shift film 2 has a function to transmit an exposure light at a predetermined transmittance, and it is difficult to ensure an optical density of a predetermined value with the phase shift film 2 alone. Therefore, it is necessary to stack the light shielding film 3 on the phase shift film 2 at the stage of manufacturing the mask blank 100 to ensure lacking optical density. With such a structure of the mask blank 100, the phase shift mask 200 ensuring a predetermined value of optical density on the outer peripheral region can be manufactured by removing the light shielding film 3 of the region using the phase shift effect (basically transfer pattern forming region) during manufacture of the phase shift mask 200 (FIG. 2).

A single layer structure and a stacked structure of two or more layers are applicable to the light shielding film 3. Further, each layer in the light shielding film of a single layer structure and the light shielding film with a stacked structure of two or more layers can be configured by approximately the same composition in the thickness direction of the layer or the film, or with a composition gradient in the thickness direction of the layer.

The mask blank 100 in the embodiment shown in FIG. 1 is configured as a structure where the light shielding film 3 is stacked on the phase shift film 2 without an intervening film. For the light shielding film 3 in the case of this structure, it is necessary to apply a material having sufficient etching selectivity to an etching gas used in forming a pattern on the phase shift film 2. The light shielding film 3 in this case is preferably formed from a material containing chromium. Materials containing chromium for forming the light shielding film 3 can include, in addition to chromium metal, a material containing chromium and one or more elements selected from oxygen, nitrogen, carbon, boron, and fluorine. While a chromium-based material is generally etched by a mixed gas of chlorine-based gas and oxygen gas, etching rate of the chromium metal to the etching gas is not as high. Considering enhancing etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among indium, molybdenum, and tin can be included in the material containing chromium for forming the light shielding film 3. Including one or more elements among indium, molybdenum, and tin can increase etching rate to the mixed gas of chlorine-based gas and oxygen gas.

On the other hand, as a mask blank 100 of another embodiment, this invention includes a structure where another film (etching stopper film) is intervened between the phase shift film 2 and the light shielding film 3. In this case, a preferable structure is that the etching stopper film is formed from the material containing chromium given above, and the light shielding film 3 is formed from a material containing silicon or a material containing tantalum.

Material containing silicon for forming the light shielding film 3 can include a transition metal, and metal elements other than the transition metal can also be included. The reason is that in the case where the phase shift mask 200 is manufactured from this mask blank 100, the pattern formed by the light shielding film 3 is basically a light shielding band pattern of an outer peripheral region having less accumulation of irradiation of ArF exposure light compared to a transfer pattern region, and the light shielding film 3 rarely remains in a fine pattern so that substantial problems hardly occur even if ArF light fastness is low. Another reason is that including a transition metal in the light shielding film 3 significantly enhances light shielding performance compared to the case without a transition metal, which enables reduction of the thickness of the light shielding film 3. The transition metals to be included in the light shielding film 3 include a metal such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or a metal alloy thereof.

In the mask blank 100, a preferable structure is that a hard mask film 4 formed from a material having etching selectivity to an etching gas used in etching the light shielding film 3 is further stacked on the light shielding film 3. Since the light shielding film 3 must have a function to ensure a predetermined optical density, there is a limitation to reduce its thickness. The film thickness of the hard mask film 4 is sufficient if the film thickness functions as an etching mask until the completion of dry etching for forming a pattern on the light shielding film 3 immediately below the hard mask film 4, and basically is not limited with regard to optical density. Therefore, the thickness of the hard mask film 4 can be reduced significantly compared to the thickness of the light shielding film 3. Since the film thickness of the resist film of an organic material is sufficient if the film thickness functions as an etching mask until dry etching for forming a pattern on the hard mask film is completed, the thickness can be reduced significantly compared to conventional resist film. Reduction of film thickness of a resist film is effective for enhancing resist resolution and preventing collapse of pattern, which is extremely important in facing requirements for miniaturization.

In the case where the light shielding film 3 is formed from a material containing chromium, the hard mask film 4 is preferably formed from the material containing silicon given above. Since the hard mask film 4 in this case tends to have low adhesiveness with the resist film of an organic material, it is preferable to treat the surface of the hard mask film 4 with HMDS (Hexamethyldisilazane) to enhance surface adhesiveness. The hard mask film 4 in this case is more preferably formed from $SiO_2$, SiN, SiON, etc.

Further, in the case where the light shielding film 3 is formed from a material containing chromium, materials containing tantalum are also applicable as the materials of the hard mask film 4, in addition to the above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, and TaBOCN. Further, in the case where the light shielding film 3 is formed from a material containing silicon, the hard mask film 4 is preferably formed from the material containing chromium given above.

In the mask blank 100, a resist film of an organic material is preferably formed in contact with the surface of the hard mask film 4 at a film thickness of 100 nm or less. In the case of a fine pattern to meet DRAM hp32 nm generation, a SRAF (Sub-Resolution Assist Feature) with 40 nm line width may be provided on a transfer pattern (phase shift pattern) to be formed on the hard mask film 4. However, even in this case, cross-sectional aspect ratio of the resist pattern can be reduced down to 1:2.5 or less so that collapse and falling off of the resist pattern can be prevented in rinsing and developing of the resist film. The resist film preferably has a film thickness of 80 nm or less.

The phase shift mask 200 of this embodiment is characterized in that a transfer pattern (phase shift pattern 2a) is formed on the phase shift film 2 of the mask blank 100, and a pattern including a light shielding band pattern is formed on the light shielding film 3. In the case of a structure where the hard mask film 4 is provided on the mask blank 100, the hard mask film 4 is removed during manufacture of the phase shift mask 200.

The method for manufacturing the phase shift mask 200 of this invention uses the mask blank 100 mentioned above, which is characterized in including the steps of forming a transfer pattern on the light shielding film 3 by dry etching; forming a transfer pattern on the phase shift film 2 by dry etching with the light shielding film 3 including the transfer pattern as a mask; and forming a pattern including a light shielding band pattern on the light shielding film 3 by dry etching with a resist film (second resist pattern) 6b having a pattern including the light shielding band pattern as a mask. The method for manufacturing the phase shift mask 200 of this invention is explained below according to the manufacturing steps shown in FIG. 2. The method explained herein is the method for manufacturing the phase shift mask 200 using the mask blank 100 having the hard mask film 4 stacked on the light shielding film 3. Further, a material containing chromium is applied to the light shielding film 3, and a material containing silicon is applied to the hard mask film 4.

Figure 2A:
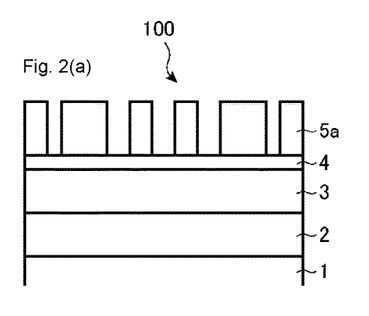
FIGS. 2(a)-2(g) are schematic cross-sectional views showing a manufacturing process of the phase shift mask of an embodiment of this invention.

First, a resist film was formed in contact with the hard mask film 4 of the mask blank 100 by spin coating. Next, a first pattern, which is a transfer pattern (phase shift pattern)

to be formed on the phase shift film 2, was exposed and drawn with an electron beam on the resist film, and a predetermined treatment such as developing was conducted, to thereby form a resist film (first resist pattern) 5a having a phase shift pattern (see FIG. 2(a)). Subsequently, dry etching was conducted using fluorine-based gas with the first resist pattern 5a as a mask, and a first pattern (hard mask pattern 4a) was formed on the hard mask film 4 (see FIG. 2(b)).

Figure 2B:
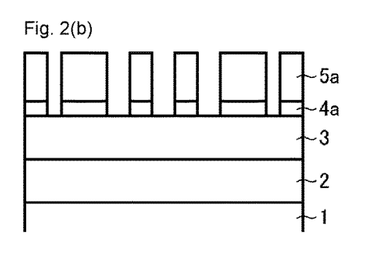
Figure 2C:
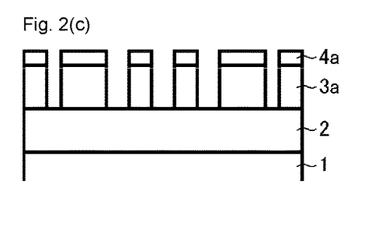
Figure 2D:
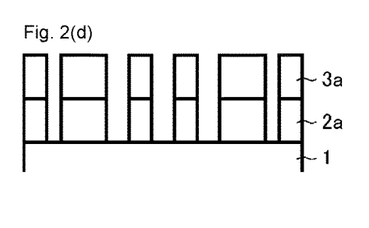
Figure 2E:
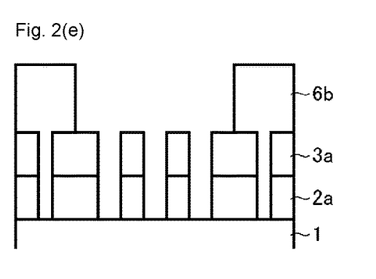
Figure 2F:
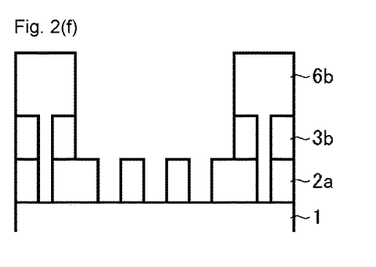
Figure 2G:
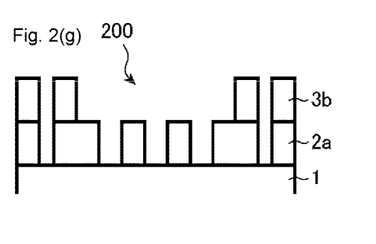

Next, after removing the first resist pattern 5a, dry etching was conducted using a mixed gas of chlorine-based gas and oxygen gas with the hard mask pattern 4a as a mask, and a first pattern (light shielding pattern 3a) was formed on the light shielding film 3 (see FIG. 2(c)). Subsequently, dry etching was conducted using fluorine-based gas with the light shielding pattern 3a as a mask, and a first pattern (phase shift pattern 2a) was formed on the phase shift film 2, and at the same time the hard mask pattern 4a was removed (see FIG. 2(d)).

Next, a resist film was formed on the mask blank 100 by spin coating. Next, a second pattern, which is a pattern (light shielding pattern) to be formed on the light shielding film 3, was exposed and drawn with an electron beam on the resist film, and a predetermined treatment such as developing was conducted, to thereby form a second resist pattern 6b having a light shielding pattern (see FIG. 2(e)). Subsequently, dry etching was conducted using a mixed gas of chlorine-based gas and oxygen gas with the second resist pattern 6b as a mask, and a second pattern (light shielding pattern 3b) was formed on the light shielding film 3 (see FIG. 2(f)). Further, the second resist pattern 6b was removed, a predetermined treatment such as cleaning was conducted, and the phase shift mask 200 was obtained (see FIG. 2(g)).

There is no particular limitation to a chlorine-based gas used for the dry etching described above, as long as Cl is included, for example, $Cl_2$, $SiCl_2$, $CHCl_3$, $CH_2Cl_2$, $CCl_4$, and $BCl_3$. Further, there is no particular limitation to a fluorine-based gas to be used for the dry etching described above, as long as F is included, for example, $CHF_3$, $CF_4$, $C_2F_6$, $C_4F_8$, and $SF_6$. Particularly, fluorine-based gas free of C can further reduce damage on a glass substrate for having a relatively low etching rate to a glass substrate.

The phase shift mask 200 of this invention is formed using the mask blank 100 mentioned above. Therefore, the phase shift film 2 having a transfer pattern formed thereon (phase shift pattern 2a) has a transmittance of 2% or more and less than 10% to ArF exposure light, and a phase difference that generates between the exposure light transmitted through the phase shift pattern 2a and the exposure light transmitted through the air for the same distance as a thickness of the phase shift pattern 2a is in the range between 150 degrees or more and 190 degrees.

Namely, the phase shift mask 200 of this invention has at least the phase shift pattern 2a on the transparent substrate 1. This phase shift pattern 2a has a function to transmit an exposure light of ArF excimer laser at a transmittance of 2% or more and less than 10%, and a function to generate a phase difference of 150 degrees or more and 190 degrees or less between the exposure light transmitted through the phase shift pattern 2a and the exposure light transmitted through the air for the same distance as a thickness of the phase shift pattern 2a. This phase shift pattern 2a includes a structure where the lower layer 21 and the upper layer 22 are stacked from the transparent substrate 1 side. The lower layer 21 is formed from a material containing metal and silicon and substantially free of oxygen, and the upper layer 22 is formed from a material containing metal, silicon, nitrogen, and oxygen. The thickness of the lower layer 21 is less than the thickness of the upper layer 22, and the ratio of metal content to total content of metal and silicon in the upper layer 22 is less than the ratio of metal content to total content of metal and silicon in the lower layer 21. The phase shift mask 200 of this invention can have a light shielding pattern 3b including a light shielding band pattern on the phase shift pattern 2a.

The phase shift mask 200 of this invention can reduce changes in phase shift amount and transmittance to exposure light caused by elution of metal elements from the phase shift pattern 2a and further advancement of oxidization on the surface layer, regardless of the phase shift pattern 2a being formed from a material containing metal and silicon. In addition, an etching end point can be detected relatively easily upon EB defect repair on a black defect of the phase shift pattern 2a discovered in a mask inspection carried out during the manufacturing process of the phase shift mask 200.

Method for manufacturing the semiconductor device of this invention is characterized in using the phase shift mask 200 manufactured using the phase shift mask 200 given above or the mask blank 100 given above, and subjecting a resist film on a semiconductor substrate to exposure transfer of a pattern. Therefore, changes in optical properties of the phase shift mask 200 before and after mask cleaning are small, and even if an exposure transfer was made on the resist film on the semiconductor device using the phase shift mask 200 after mask cleaning, the pattern can be transferred on the resist film on the semiconductor device at a precision sufficiently satisfying the design specification. Further, even if an exposure transfer was made on the resist film on the semiconductor device using the phase shift mask 200 having repaired its black defect part through EB defect repair during its manufacture, a transfer failure does not occur on the resist film on the semiconductor device corresponding to the phase shift pattern portion of the phase shift mask 200 upon which the black defect existed. Therefore, in the case where a circuit pattern was formed by dry-etching a lower layer film using this resist film pattern as a mask, a highly precise circuit pattern can be formed without disconnection and short-circuit of wires caused by poor precision or transfer failure.

EXAMPLES

The embodiments of this invention are further described concretely below along with examples.

Example 1

[Manufacture of Mask Blank]

A transparent substrate 1 formed from a synthetic quartz glass with a size of a main surface of about 152 mm×about 152 mm and a thickness of about 6.35 mm was prepared. Edge surfaces and the main surface of the transparent substrate 1 were polished to a predetermined surface roughness, and thereafter subjected to predetermined cleaning treatment and drying treatment.

Next, the transparent substrate 1 was placed in a single-wafer DC sputtering apparatus, and by reactive sputtering (DC sputtering) using a mixed target of molybdenum (Mo) and silicon (Si) (Mo:Si=11 atomic %:89 atomic %) and with a mixed gas of argon (Ar) and helium (He) as a sputtering gas, a lower layer 21 of a phase shift film 2 formed from molybdenum and silicon (MoSi film) was formed on the transparent substrate 1 at a thickness of 7 nm.

Next, the transparent substrate 1 with the lower layer 21 formed thereon was placed in the single-wafer DC sputtering apparatus, and by reactive sputtering (DC sputtering) using a mixed target of molybdenum (Mo) and silicon (Si) (Mo:Si=4 atomic %:96 atomic %) and with a mixed gas of argon (Ar), nitrogen ($N_2$), oxygen ($O_2$), and helium (He) as a sputtering gas, an upper layer 22 of the phase shift film 2 formed from molybdenum, silicon, nitrogen, and oxygen (MoSiON film) was formed on the lower layer 21 at a thickness of 72 nm. By the above procedure, the phase shift film 2 with the lower layer 21 and the upper layer 22 stacked in contact with the surface of the transparent substrate 1 was formed at a thickness of 79 nm.

Next, the transparent substrate 1 having the phase shift film 2 formed thereon was subjected to heat treatment for reducing film stress of the phase shift film 2 and for forming an oxidization layer on the surface layer. Concretely, the heat treatment was carried out using a heating furnace (electric furnace) at a heating temperature of 450° C. in the atmosphere for one hour. Another transparent substrate 1 was prepared, with its main surface provided with a phase shift film 2 with a lower layer 21 and an upper layer 22 stacked under the same conditions, and which was subjected to heat treatment. Transmittance and phase difference of the phase shift film 2 to a light of 193 nm wavelength were measured using a phase shift measurement apparatus (MPM193 manufactured by Lasertec), and the transmittance was 6.1% and the phase difference was 171.1 degrees. Further, the phase shift film 2 was inspected by STEM and EDX, and formation of an oxidization layer was confirmed, at a thickness of about 1.5 nm from the surface of the upper layer 22 of the phase shift film 2. Moreover, the optical properties were measured for each of the lower layer 21 and the upper layer 22 of the phase shift film 2, and the lower layer 21 had a refractive index n of 1.16 and extinction coefficient k of 2.91, and the upper layer 22 had refractive index n of 2.38 and extinction coefficient k of 0.32. Further, front-surface reflectance of the phase shift film 2 (reflectance on front surface of phase shift film 2) was 20.6%, and back-surface reflectance (reflectance at transparent substrate 1 side) was 36.2%.

Next, the transparent substrate 1 having the phase shift film 2 formed thereon was placed in the single-wafer DC sputtering apparatus, and by reactive sputtering (DC sputtering) using chromium (Cr) target, with a mixed gas of argon (Ar), carbon dioxide ($CO_2$), nitrogen ($N_2$), and helium (He) (flow ratio Ar:$CO_2$:$N_2$:He=22:39:6:33, pressure=0.2 Pa) as a sputtering gas, and with electric power from DC power source at 1.9 kW, a lowermost layer of the light shielding film 3 formed from CrOCN was formed on the phase shift film 2 at a thickness of 30 nm.

Next, by reactive sputtering (DC sputtering) using the same chromium (Cr) target with a mixed gas of argon (Ar) and nitrogen ($N_2$) (flow ratio Ar:$N_2$=83:17, pressure=0.1 Pa) as a sputtering gas, and with electric power from DC power source at 1.4 kW, a lower layer of the light shielding film 3 formed from CrN was formed on the lowermost layer of the light shielding film 3 at a thickness of 4 nm.

Next, by reactive sputtering (DC sputtering) using the same chromium (Cr) target, with a mixed gas of argon (Ar), carbon dioxide ($CO_2$), nitrogen ($N_2$), and helium (He) (flow ratio Ar:$CO_2$:$N_2$:He=21:37:11:31, pressure=0.2 Pa) as a sputtering gas, and with electric power from DC power source at 1.9 kW, an upper layer of the light shielding film 3 formed from CrOCN was formed on the lower layer of the light shielding film 3 at a thickness of 14 nm. By the above procedure, the light shielding film 3 formed from chromium-based materials of a three-layer structure including the lowermost layer of CrOCN, the lower layer of CrN, and the upper layer of CrOCN, in order from the phase shift film 2 side, was formed at a total film thickness of 48 nm. The optical density (OD) of the stacked structure of the phase shift film 2 and the light shielding film 3 was 3.0 or more at a wavelength of 193 nm.

Further, the transparent substrate 1 with the phase shift film 2 and the light shielding film 3 stacked thereon was placed in a single-wafer RF sputtering apparatus, and by RF sputtering using silicon dioxide ($SiO_2$) as a target with argon (Ar) gas as a sputtering gas, a hard mask film 4 formed from silicon and oxygen was formed on the light shielding film at a thickness of 5 nm. Through the above procedure, the mask blank 100 having a structure where the phase shift film 2 of a two-layer structure, the light shielding film 3, and the hard mask film 4 are stacked on the transparent substrate 1 was manufactured.

[Manufacture of Phase Shift Mask]

Next, a phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with the surface of the hard mask film 4 by spin coating at a film thickness of 80 nm. Next, a first pattern, which is a phase shift pattern to be formed on the phase shift film 2, was drawn on the resist film with electron beam, predetermined cleaning and developing treatments were conducted, and a first resist pattern 5a having the first pattern was formed (FIG. 2(a)). In the first pattern subjected to electron beam drawing herein, a program defect was added in addition to the phase shift pattern that is to be originally formed, so that a black defect is formed on the phase shift film 2.

Next, dry etching using $CF_4$ gas was conducted with the first resist pattern 5a as a mask, and the first pattern (hard mask pattern 4a) was formed in the hard mask film 4 (FIG. 2(b)).

Next, the first resist pattern 5a was removed. Subsequently, dry etching was conducted using a mixed gas of chlorine and oxygen (gas flow ratio $Cl_2$:$O_2$=4:1) with the hard mask pattern 4a as a mask, and a first pattern (light shielding pattern 3a) was formed on the light shielding film 3 (see FIG. 2(c)). Next, dry etching was conducted using fluorine-based gas ($SF_6$+He) with the light shielding pattern 3a as a mask, and a first pattern (phase shift pattern 2a) was formed on the phase shift film 2, and at the same time the hard mask pattern 4a was removed (FIG. 2(d)).

Next, a resist film of a chemically amplified resist for electron beam writing was formed on the light shielding pattern 3a by spin coating at a film thickness of 150 nm. Next, a second pattern, which is a pattern (light shielding pattern) to be formed on the light shielding film 3, was exposed and drawn on the resist film, further subjected to predetermined treatments such as developing, and a second resist pattern 6b having the light shielding pattern was formed (FIG. 2(e)). Subsequently, dry etching was conducted with a mixed gas of chlorine and oxygen (gas flow ratio $Cl_2$:$O_2$=4:1) using the second resist pattern 6b as a mask, and a second pattern (light shielding pattern 3b) was formed on the light shielding film 3 (FIG. 2(f)). Further, the second resist pattern 6b was removed, predetermined treatment such as cleaning was carried out, and the phase shift mask 200 was obtained (FIG. 2(g)).

The half tone phase shift mask 200 of Example 1 manufactured was subjected to mask pattern inspection by a mask inspection apparatus, and the presence of a black defect was confirmed on the phase shift pattern 2a of a location where a program defect was arranged. The black defect portion was subjected to EB defect repair, resulting in easy detection of an etching end point and etching on the surface of the transparent substrate 1 was minimized.

A simulation was made on a transfer image of the half tone phase shift mask 200 of Example 1 after EB defect repair using AIMS193 (manufactured by Carl Zeiss) on when exposure transfer was made on a resist film on a semiconductor device with an exposure light of 193 nm wavelength. The simulated exposure transfer image was inspected, recognizing that the design specification was fully satisfied. Further, the transfer image of the portion subjected to EB defect repair was comparable to the transfer images of other regions. It can be considered from this result that the circuit pattern finally formed on the semiconductor device can be formed at a high precision, even if the phase shift mask 200 of Example 1 after EB defect repair was set on a mask stage of an exposure apparatus and the resist film on the semiconductor device was subjected to exposure transfer.

Example 2

[Manufacture of Mask Blank]

A mask blank 100 of Example 2 was manufactured by the same procedure as Example 1, except for a phase shift film 2. The changes made in the phase shift film 2 of Example 2 are the material forming the lower layer 21, and film thickness of each of the lower layer 21 and the upper layer 22. Concretely, a transparent substrate 1 was placed in a single-wafer DC sputtering apparatus, and by reactive sputtering (DC sputtering) using a mixed target of molybdenum (Mo) and silicon (Si) (Mo:Si=13 atomic %:87 atomic %), with a mixed gas of argon (Ar), nitrogen ($N_2$), and helium (He) as a sputtering gas, a lower layer 21 of the phase shift film 2 formed from molybdenum, silicon, and nitrogen (MoSiN film) was formed on the transparent substrate 1 at a thickness of 7.7 nm.

Next, the transparent substrate 1 with the lower layer 21 formed thereon was placed in the single-wafer DC sputtering apparatus, and by reactive sputtering (DC sputtering) using a mixed target of molybdenum (Mo) and silicon (Si) (Mo:Si=4 atomic %:96 atomic %), with a mixed gas of argon (Ar), nitrogen ($N_2$), oxygen ($O_2$), and helium (He) as a sputtering gas, an upper layer 22 of the phase shift film 2 formed from molybdenum, silicon, nitrogen, and oxygen (MoSiON film) was formed on the lower layer 21 at a thickness of 71.0 nm. Through the above procedure, the phase shift film 2 having the lower layer 21 and the upper layer 22 stacked in contact with the surface of the transparent substrate 1 was formed at a thickness of 78.7 nm.

Further, the phase shift film 2 of Example 2 was also subjected to heat treatment under the same treatment conditions as Example 1. Another transparent substrate 1 was prepared, with its main surface provided with the phase shift film 2 of Example 2 under the same conditions, and which was subjected to heat treatment. Transmittance and phase difference of the phase shift film 2 to a light of 193 nm wavelength were measured using a phase shift measurement apparatus (MPM193 manufactured by Lasertec), and transmittance was 6.13% and phase difference was 170.5 degrees. Further, the phase shift film 2 was inspected by STEM and EDX, and formation of an oxidization layer was confirmed at a thickness of about 1.5 nm from the surface of the upper layer 22 of the phase shift film 2. Moreover, the optical properties were measured for each of the lower layer 21 and the upper layer 22 of the phase shift film 2, and the lower layer 21 had refractive index n of 1.20 and extinction coefficient k of 2.78, and the upper layer 22 had refractive index n of 2.38 and extinction coefficient k of 0.32.

Through the above procedure, the mask blank 100 of Example 2 was manufactured, the mask blank 100 having a structure in which the phase shift film 2 including the lower layer 21 of MoSiN and the upper layer 22 of MoSiON, the light shielding film 3, and the hard mask film 4 are stacked on the transparent substrate 1.

[Manufacture of Phase Shift Mask]

Next, a phase shift mask 200 of Example 2 was manufactured using the mask blank 100 of Example 2 through the same procedure as Example 1.

The half tone phase shift mask 200 of Example 2 manufactured was subjected to mask pattern inspection by a mask inspection apparatus, and the presence of a black defect was confirmed on the phase shift pattern 2a of a location where a program defect was arranged. The black defect portion was subjected to EB defect repair, resulting in easy detection of an etching end point and etching on the surface of the transparent substrate 1 was minimized.

A simulation was made on a transfer image of the half tone phase shift mask 200 of Example 2 after EB defect repair using AIMS193 (manufactured by Carl Zeiss) on when exposure transfer was made on a resist film on a semiconductor device with an exposure light of 193 nm wavelength. The simulated exposure transfer image was inspected, recognizing that the design specification was fully satisfied. Further, the transfer image of the portion subjected to EB defect repair was comparable to the transfer images of other zones. It can be considered from this result that the circuit pattern finally formed on the semiconductor device can be formed at a high precision, even if the phase shift mask 200 of Example 2 after EB defect repair was set on a mask stage of an exposure apparatus and the resist film on the semiconductor device was subjected to exposure transfer.

Example 3

[Manufacture of Mask Blank]

A mask blank 100 of Example 3 was manufactured by the same procedure as Example 1, except for a phase shift film 2. The changes made in the phase shift film 2 of Example 3 are the material forming the lower layer 21, and film thickness of each of the lower layer 21 and the upper layer 22. Concretely, a transparent substrate 1 was placed in a single-wafer DC sputtering apparatus, and by reactive sputtering (DC sputtering) using a mixed target of molybdenum (Mo) and silicon (Si)(Mo:Si=13 atomic %:87 atomic %) and with a mixed gas of argon (Ar), nitrogen ($N_2$), and helium (He) as a sputtering gas, the lower layer 21 of a phase shift film 2 formed from molybdenum, silicon, and nitrogen (MoSiN film) was formed on the transparent substrate 1 at a thickness of 4.5 nm.

Next, the transparent substrate 1 having the lower layer 21 formed thereon was placed in the single-wafer DC sputtering apparatus, and by reactive sputtering (DC sputtering) using a mixed target of molybdenum (Mo) and silicon (Si) (Mo:Si=4 atomic %:96 atomic %) and with a mixed gas of argon (Ar), nitrogen ($N_2$), oxygen ($O_2$), and helium (He) as a sputtering gas, an upper layer 22 of the phase shift film 2 formed from molybdenum, silicon, nitrogen, and oxygen (MoSiON film) was formed on the lower layer 21 at a thickness of 72.1 nm. By the above procedure, the phase shift film 2 having the lower layer 21 and the upper layer 22 stacked in contact with the surface of the transparent substrate 1 was formed at a thickness of 76.6 nm.

Further, the phase shift film 2 of Example 3 was also subjected to heat treatment under the same treatment conditions as Example 1. Another transparent substrate 1 was prepared, with its main surface provided with the phase shift film 2 of Example 3 under the same conditions, and which was subjected to heat treatment. Transmittance and phase difference of the phase shift film 2 to a light of 193 nm wavelength were measured using a phase shift measurement apparatus (MPM193 manufactured by Lasertec), and transmittance was 6.08% and phase difference was 170.2 degrees. Further, the phase shift film 2 was inspected by STEM and EDX, and formation of an oxidization layer was confirmed at a thickness of about 1.5 nm from the surface of the upper layer 22 of the phase shift film 2. Moreover, the optical properties were measured for each of the lower layer 21 and the upper layer 22 of the phase shift film 2, and the lower layer 21 had refractive index n of 1.52 and extinction coefficient k of 2.73, and the upper layer 22 had refractive index n of 2.38 and extinction coefficient k of 0.32.

Through the above procedure, the mask blank 100 of Example 3 was manufactured, the mask blank 100 having a structure in which the phase shift film 2 including the lower layer 21 of MoSiN and the upper layer 22 of MoSiON, the light shielding film 3, and the hard mask film 4 are stacked on the transparent substrate 1.

[Manufacture of Phase Shift Mask]

Next, a phase shift mask 200 of Example 3 was manufactured using the mask blank 100 of Example 3, through the same procedure as Example 1.

The half tone phase shift mask 200 of Example 3 manufactured was subjected to mask pattern inspection by a mask inspection apparatus, and the presence of a black defect was confirmed on the phase shift pattern 2a of a location where a program defect was arranged. The black defect portion was subjected to EB defect repair, resulting in easy detection of an etching end point and etching on the surface of the transparent substrate 1 was minimized.

A simulation was made on a transfer image of the half tone phase shift mask 200 of Example 2 after EB defect repair using AIMS193 (manufactured by Carl Zeiss) on when exposure transfer was made on a resist film on a semiconductor device with an exposure light of 193 nm wavelength. The simulated exposure transfer image was inspected, recognizing that the design specification was fully satisfied. Further, the transfer image of the portion subjected to EB defect repair was comparable to the transfer images of other regions. It can be considered from this result that the circuit pattern finally formed on the semiconductor device can be formed at a high precision, even if the phase shift mask 200 of Example 3 after EB defect repair was set on a mask stage of an exposure apparatus and the resist film on the semiconductor device was subjected to exposure transfer.

Comparative Example 1

[Manufacture of Mask Blank]

A mask blank of Comparative Example 1 was manufactured by the same procedure as Example 1, except for a phase shift film 2. A single layer structure film formed from molybdenum, silicon, nitrogen, and oxygen was applied for the phase shift film 2 of Comparative Example 1. Concretely, a transparent substrate 1 was placed in a single-wafer DC sputtering apparatus, and by reactive sputtering (DC sputtering) using a mix-sintered target of molybdenum (Mo) and silicon (Si) (Mo:Si=4 atomic %:96 atomic %) and with a mixed gas of argon (Ar), nitrogen ($N_2$), oxygen ($O_2$), and helium (He) as a sputtering gas, a phase shift film 2 formed from molybdenum, silicon, nitrogen, and oxygen was formed at a thickness of 66 nm.

Further, the phase shift film 2 was subjected to heat treatment under the same treatment conditions as Example 1. Another transparent substrate 1 was prepared, with its main surface provided with the phase shift film 2 of Comparative Example 1 under the same conditions, and which was subjected to heat treatment. Transmittance and phase difference of the phase shift film 2 to a light of 193 nm wavelength were measured using a phase shift measurement apparatus (MPM193 manufactured by Lasertec), and transmittance was 12.1% and phase difference was 177.1 degrees. Further, the phase shift film 2 was inspected by STEM and EDX, and formation of an oxidization layer was confirmed at a thickness of about 1.7 nm from the surface of the phase shift film 2. Moreover, the optical properties of the phase shift film 2 were measured, and refractive index n was 2.48 and extinction coefficient k was 0.45.

Through the above procedure, a mask blank of Comparative Example 1 was manufactured, the mask blank having a structure in which the phase shift film 2 of MoSiON, the light shielding film 3, and the hard mask film 4 are stacked on the transparent substrate 1.

[Manufacture of Phase Shift Mask]

Next, a phase shift mask of Comparative Example 1 was manufactured using the mask blank of Comparative Example 1, through the same procedure as Example 1.

The half tone phase shift mask of Comparative Example 1 manufactured was subjected to mask pattern inspection by a mask inspection apparatus, and the presence of a black defect was confirmed on the phase shift pattern 2a of a location where a program defect was arranged. The black defect portion was subjected to EB defect repair, resulting in difficulty in detecting an etching end point so that the etching advanced from the surface of the transparent substrate 1.

A simulation was made on a transfer image of the half tone phase shift mask 200 of Example 1 after EB defect repair using AIMS193 (manufactured by Carl Zeiss) on when exposure transfer was made on a resist film on a semiconductor device with an exposure light of 193 nm wavelength. The simulated exposure transfer image was inspected, recognizing that the design specification was generally fully satisfied, except for the portions subjected to EB defect repair. The transfer image of the part subjected to EB defect repair was of a level generating a transfer failure caused by an influence of etching on the transparent substrate 1, etc. It can be considered from this result that when the phase shift mask of Comparative Example 1 after EB defect repair was set on a mask stage of an exposure apparatus and the resist film on the semiconductor device was subjected to exposure transfer, disconnection and short-circuit is expected in a circuit pattern finally formed on the semiconductor device.

DESCRIPTION OF REFERENCE NUMERALS 1 transparent substrate
2 phase shift film
21 lower layer
22 upper layer
2a phase shift pattern
3 light shielding film
3a, 3b light shielding pattern 4 hard mask film
4a hard mask pattern
5a first resist pattern
6b second resist pattern
100 mask blank
200 phase shift mask

What is claimed is:

1. A mask blank comprising a phase shift film on a transparent substrate, wherein:
the phase shift film has a function to transmit an exposure light of an ArF excimer laser at a transmittance of 2% or more and less than 10% and a function to generate a phase difference of 150 degrees or more and 190 degrees or less between the exposure light transmitted through the phase shift film and the exposure light transmitted through air for a same distance as a thickness of the phase shift film,
the phase shift film has a structure where a lower layer and an upper layer are stacked from a side of the transparent substrate,
the lower layer is formed from a material containing metal and silicon and substantially free of oxygen,
the upper layer is formed from a material containing metal, silicon, nitrogen, and oxygen,
a thickness of the lower layer is less than a thickness of the upper layer, and
a ratio of a content of metal to a total content of metal and silicon in the upper layer is less than a ratio of a content of the metal to a total content of the metal and silicon in the lower layer.

2. The mask blank according to claim 1, wherein a ratio of a content of the metal to a total content of the metal and silicon in the upper layer is 7% or less.

3. The mask blank according to claim 1, wherein a ratio of a content of the metal to a total content of the metal and silicon in the lower layer is 8% or more.

4. The mask blank according to claim 1, wherein the lower layer is formed in contact with a surface of the transparent substrate.

5. The mask blank according to claim 1, wherein the lower layer is formed from a material comprising metal and silicon.

6. The mask blank according to claim 1, wherein the phase shift film has a thickness of 90 nm or less.

7. The mask blank according to claim 1, wherein the lower layer has a thickness of 2 nm or more.

8. The mask blank according to claim 1, wherein the upper layer includes a layer with more oxygen content on a surface layer than a portion of the upper layer excluding the surface layer.

9. The mask blank according to claim 1 comprising a light shielding film on the phase shift film.

10. A phase shift mask having a transfer pattern formed on the phase shift film of the mask blank of claim 9, and wherein a pattern including a light shielding band pattern is formed on the light shielding film.

11. A method for manufacturing a phase shift mask using the mask blank according to claim 9, comprising the steps of:
forming a transfer pattern on the light shielding film by dry etching,
forming a transfer pattern on the phase shift film by dry etching with the light shielding film having the transfer pattern as a mask, and
forming a pattern including a light shielding band pattern on the light shielding film by dry etching with a resist film having a pattern including a light shielding band pattern as a mask.

12. A method for manufacturing a semiconductor device comprising the step of using the phase shift mask according to claim 10 and subjecting a resist film on a semiconductor substrate to exposure transfer of the transfer pattern.

13. A method for manufacturing a semiconductor device comprising the step of using the phase shift mask manufactured by the method for manufacturing the phase shift mask according to claim 11 and subjecting a resist film on a semiconductor substrate to exposure transfer of the transfer pattern.

* * * * *